United States Patent
Hari et al.

(10) Patent No.: US 9,642,274 B2
(45) Date of Patent: May 2, 2017

(54) UNINTERRUPTIBLE POWER SUPPLY HAVING ADJUSTABLE INTERFACE

(75) Inventors: Balasubramani Hari, Bangalore (IN); Arjun Jayaprakash, Bangalore (IN); Chiayuan Liu, New Taipei (TW); Shen-Yuan Chien, Taipei (TW); Shankar Gopalakrishna, Bangalore (IN)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 130 days.

(21) Appl. No.: 14/405,956

(22) PCT Filed: Jun. 6, 2012

(86) PCT No.: PCT/US2012/041071
§ 371 (c)(1),
(2), (4) Date: Dec. 5, 2014

(87) PCT Pub. No.: WO2013/184109
PCT Pub. Date: Dec. 12, 2013

(65) Prior Publication Data
US 2015/0156907 A1 Jun. 4, 2015

(51) Int. Cl.
*H05K 5/00* (2006.01)
*H05K 7/02* (2006.01)
(Continued)

(52) U.S. Cl.
CPC ............. *H05K 7/02* (2013.01); *H02J 9/00* (2013.01); *H05K 5/0017* (2013.01);
(Continued)

(58) Field of Classification Search
CPC ...... G06F 1/1679; G06F 1/1616; G06F 1/162; G06F 1/1624; G06F 1/1601;
(Continued)

(56) References Cited

U.S. PATENT DOCUMENTS 5,793,627 A * 8/1998 Caldes .................. H02J 9/00
307/64
6,812,917 B2 11/2004 Jenkins et al.
(Continued)

FOREIGN PATENT DOCUMENTS

| CN | 1607336 A | 4/2005 |
| CN | 1893146 A | 1/2007 |

(Continued)

OTHER PUBLICATIONS

Extended European Search Report from corresponding European Application No. 12878521.9 dated Feb. 12, 2016.
(Continued)

*Primary Examiner* — James Wu
(74) *Attorney, Agent, or Firm* — Lando & Anastasi, LLP

(57) ABSTRACT

A UPS with an adjustable user interface module comprises a housing having a front plane and a module configured to fit inside and secured by the housing. The module includes a body having a front face, and the module is configured to tilt within the housing such that the front face of the module can be positioned at various angles relative to the front plane of the housing.

13 Claims, 4 Drawing Sheets

(51) Int. Cl.
*H05K 7/14* (2006.01)
*H02J 9/00* (2006.01)
*G06F 1/16* (2006.01)

(52) U.S. Cl.
CPC ............ *H05K 7/1492* (2013.01); *G06F 1/166* (2013.01); *G06F 1/1679* (2013.01)

(58) Field of Classification Search
CPC ........... G06F 1/1607; G06F 2200/1631; G06F 1/1618; G06F 1/1637; G06F 1/166; G06F 1/1667; B60K 2350/405; F25D 29/005; F25D 2400/36; H05K 5/0017; H05K 5/00; H05K 7/02; B60R 11/0235; B60R 2011/0085; H04M 1/0216; H04M 1/0237; H04M 1/0295; H02J 9/00; H02J 2003/001
USPC ............ 361/679.27, 679.29, 755; 248/284.1, 248/287.1, 292.13, 292.14; 16/321, 324, 16/326
See application file for complete search history.

(56) References Cited

U.S. PATENT DOCUMENTS

| | | | |
|---|---|---|---|
| 7,137,676 B2* | 11/2006 | Sugimoto | G11B 31/00 312/223.1 |
| 7,216,401 B2 | 5/2007 | Bae | |
| 7,441,813 B2 | 10/2008 | Qin et al. | |
| 8,127,243 B2 | 2/2012 | Bakhreiba et al. | |
| 2001/0052741 A1* | 12/2001 | Yun | F16M 11/10 312/405 |
| 2002/0024488 A1 | 2/2002 | Jenkins et al. | |
| 2002/0180692 A1 | 12/2002 | Rhoads | |
| 2003/0085325 A1 | 5/2003 | Sugimoto et al. | |
| 2005/0078818 A1 | 4/2005 | Bae | |
| 2005/0109883 A1 | 5/2005 | Watanabe et al. | |
| 2007/0010219 A1 | 1/2007 | Qin et al. | |
| 2007/0284496 A1* | 12/2007 | Yokota | F16M 11/10 248/284.1 |
| 2008/0161950 A1* | 7/2008 | Ozaki | B60R 11/0211 700/94 |
| 2009/0150818 A1 | 6/2009 | Bakhreiba et al. | |
| 2010/0128458 A1 | 5/2010 | Nagami | |
| 2013/0033801 A1* | 2/2013 | Hari | H05K 5/0017 361/679.01 |

FOREIGN PATENT DOCUMENTS

| | | |
|---|---|---|
| CN | 101682714 A | 3/2010 |
| CN | 201533110 U | 7/2010 |
| CN | 201788450 U | 4/2011 |
| EP | 1850054 A2 | 10/2007 |

OTHER PUBLICATIONS

Notification of Transmittal of the International Search Report and Written Opinion of the International Searching Authority from corresponding PCT/US2012/041071 dated Aug. 6, 2012.

* cited by examiner

UNINTERRUPTIBLE POWER SUPPLY HAVING ADJUSTABLE INTERFACE

This application is a U.S. National Stage Application under 35 U.S.C. §371 from International Application No. PCT/US2012/041071, filed Jun. 6, 2012, which is hereby incorporated by reference in its entirety for all purposes.

BACKGROUND OF DISCLOSURE

1. Field of Disclosure

Embodiments of the disclosure relate generally to uninterruptible power supplies, and more specifically to an uninterruptible power supply having an adjustable user interface.

2. Discussion of Related Art

Centralized data centers for computer, communications and other electronic equipment have been in use for a number of years, and more recently, with the increasing use of the Internet, large scale data centers that provide hosting services for Internet Service Providers (ISPs), Application Service Providers (ASPs) and Internet content providers have become increasingly popular. It is often desirable to operate equipment within data centers seven days a week, 24 hours per day, with little or no disruption in service. To prevent any disruption in service, it is common practice in data centers to use uninterruptible power supplies (UPSs) to ensure that the equipment within the data centers receives continuous power throughout any black out or brown out periods.

In some instances, UPSs have an interface through which users can receive information about the UPS and provide inputs to the UPS. For example, a user interface can have a screen which displays information, such as modes of operation and system parameters. The user interface can also have buttons and/or keys that allow users to input commands to the UPS.

SUMMARY OF DISCLOSURE

An aspect of the present disclosure is directed to a UPS with an adjustable user interface. In one embodiment, the user interface module comprises a housing having a front plane and a module configured to fit inside and secured by the housing. The module includes a body having a front face, and the module is configured to tilt within the housing such that the front face of the module can be positioned at various angles relative to the front plane of the housing.

Embodiments of the user interface module may include the module being configured to tilt such that a bottom of the front face extends further than a top of the front face relative to the front plane of the housing. In some embodiments, the module is configured to tilt without the top of the front face receding into the housing. In some embodiments, the housing comprises a top surface, two side surfaces, a bottom surface, and a backing surface, wherein each side surface comprises a pivot hole positioned near the top surface, a button slot positioned near the bottom surface, and at least a first and a second locking hole positioned above the button slot. The module also includes two pivot pins configured to fit in respective pivot holes, two buttons configured to moveably fit in respective button slots, and two lock pins configured to fit in respective locking holes. In some embodiments, the pivot holes are configured such that the pivot pins can slide to more than one position within respective pivot holes. In some embodiments, the pivot pins are configured to slide to a top of respective pivot holes when the module is tilted at zero degrees relative to the front plane of the housing and to a bottom of the pivot holes when the module is tilted at a maximum degree relative to the front plane of the housing case. In some embodiments, the body of the module has two side surfaces, each side surface comprising a cutout, and wherein the button and the lock pin on each side of the module are connected and configured such that the buttons can recede into respective cutouts to an extent that the lock pins disengage from respective locking holes. In some embodiments, the front face of the module comprises a screen. In some embodiments, the front face of the module further comprises user input buttons.

Another aspect of the disclosure is directed to a method for adjusting a user interface module for an uninterruptible power supply. In some embodiments, the method comprises: moving a module including a body having a front face, the module being configured to fit inside and secured by a housing having a front plane, wherein the front face of the module is positioned at an angle relative to the front plane of the housing.

In some embodiments moving the module comprises tilting the module such that a bottom of the front face extends further than a top of the front face relative to the front plane of the housing. In some embodiments, moving the module comprises tilting the module without the top of the front face receding into the housing. In some embodiments, the front face of the module comprises a screen, and moving the module comprises changing an angle of visibility of the screen. In some embodiments, the front face of the module further comprises user input buttons, and moving the module comprises changing an angle of accessibility of the input buttons.

Still other aspects, embodiments, and advantages of these exemplary aspects and embodiments, are discussed in detail below. Any embodiment disclosed herein may be combined with any other embodiment in any manner consistent with at least one of the objects, aims, and needs disclosed herein, and references to "an embodiment," "some embodiments," "an alternate embodiment," "various embodiments," "one embodiment" or the like are not necessarily mutually exclusive and are intended to indicate that a particular feature, structure, or characteristic described in connection with the embodiment may be included in at least one embodiment. The appearances of such terms herein are not necessarily all referring to the same embodiment. The accompanying drawings are included to provide illustration and a further understanding of the various aspects and embodiments, and are incorporated in and constitute a part of this specification. The drawings, together with the remainder of the specification, serve to explain principles and operations of the described and claimed aspects and embodiments.

BRIEF DESCRIPTION OF DRAWINGS

Various aspects of at least one embodiment are discussed below with reference to the accompanying figures, which are not intended to be drawn to scale. Where technical features in the figures, detailed description or any claim are followed by references signs, the reference signs have been included for the sole purpose of increasing the intelligibility of the figures, detailed description, and claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. The figures are provided for the purposes of illustration and explanation and are not intended as a definition of the limits of the invention. In the figures:

DETAILED DESCRIPTION

It is to be appreciated that embodiments of the systems and methods discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Embodiments of the present disclosure are directed to an uninterruptible power supply (UPS) having an adjustable user interface. In some embodiments, the user interface includes a housing and a module that fits inside the housing such that the module can tilt within the housing. In some implementations, the module and the housing are configured so that a front face of the module can be held at various angles relative to a front plane of the housing or the uninterruptible power supply. This construction enables a user of the UPS to position the front face of the user interface of the UPS at an angle to more conveniently see and access the user interface, for example, in environments where the UPS may not be positioned at eye level.

Figure 1A:
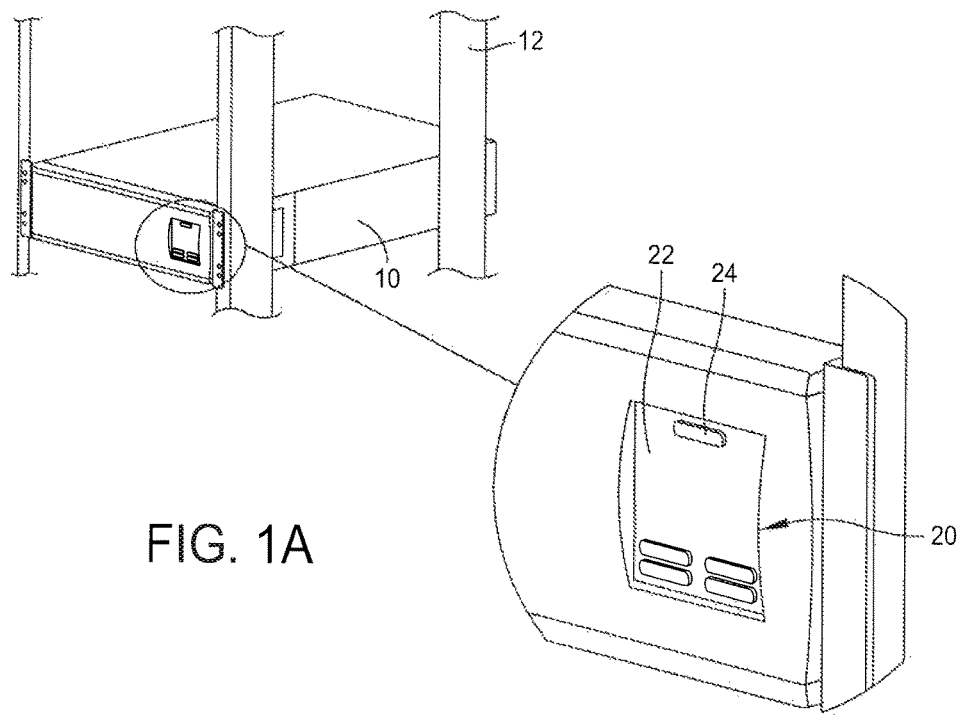
FIGS. 1A and 1B are front perspective views of an uninterruptible power supply including an adjustable user interface.
Figure 1B:
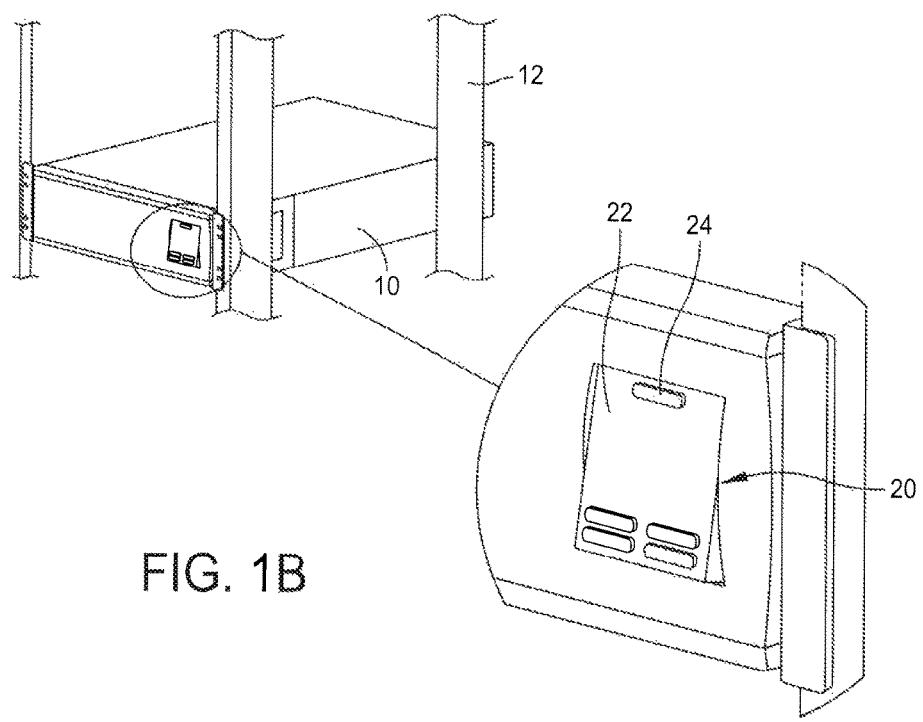

Referring to the drawings, particularly to FIGS. 1A and 1B, an uninterruptible power supply (UPS) 10 is positioned on a UPS rack 12. The UPS 10 includes an adjustable user interface 20, which includes a front face 22. In some embodiments, the adjustable user interface 20 includes input buttons and/or keys 24 on the front face 22. The UPS rack 12 can be configured to accommodate more than one UPS, for example, with multiple UPS modules secured in a vertical configuration. Thus, in some embodiments, UPS modules can be positioned at varying levels relative to the ground, ranging from resting on or near ground level to being suspended above eye level. In some embodiments, the UPS rack 12 can be raised off of the ground, for example, on a table-top configuration, or the UPS 10 can be placed on a table or other structure without the UPS rack 12. The adjustable user interface 20 can be adjusted to tilt and hold the front face 22 at an angle relative to the front of the UPS 10. By tilting the user interface 20, the front face 22 can be more easily visible, for example, when the UPS 10 is placed on the floor or at a level lower than eye level.

In FIG. 1A, the user interface 20 is shown untilted. For a UPS 10 positioned on the floor or on a lower portion of a UPS rack 12, the front face 22 can be more difficult to see from a higher vantage point, such as eye level when a user is standing or sitting. FIG. 1B illustrates the user interface 20 tilted upwards so that the front face 22 is more visible from such a vantage point. In addition, the input buttons 24 on the front face 22 can be more easily accessible from a higher vantage point when the user interface 20 is tilted upwards.

Figure 2A:
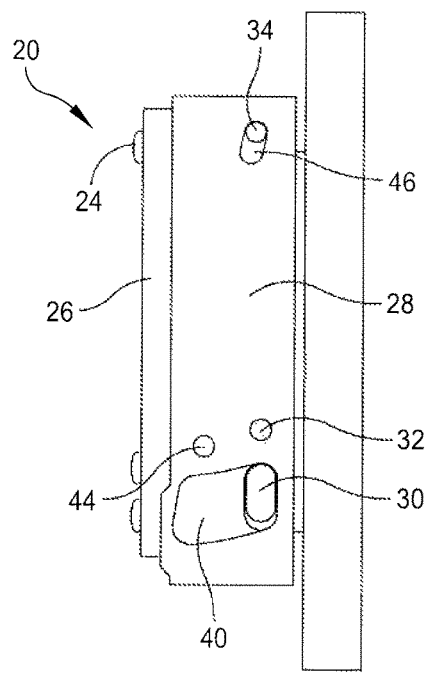
FIGS. 2A and 2B are side views of the adjustable user interface illustrated in FIGS. 1A and 1B, respectively.
Figure 2B:
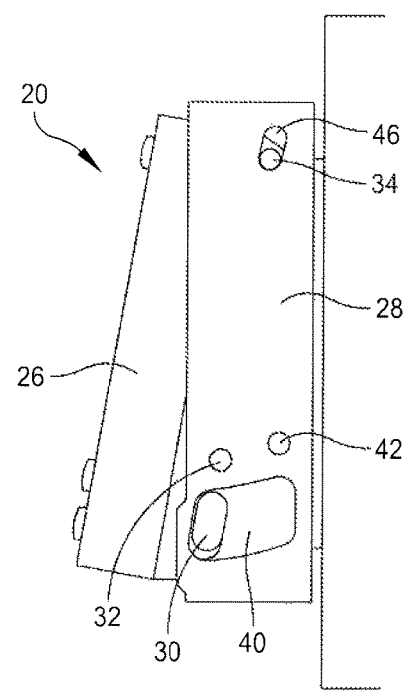

Referring to FIGS. 2A and 2B, the user interface 20 includes a module 26 fitted inside a housing 28. FIG. 2A illustrates the module 26 in an untilted position, where the front face 22 is at 0 degrees relative to a front plane of the housing 28. FIG. 2B shows the module 26 tilted upward relative to the front plane of the housing 28. The module has a button 30 that fits into a button slot 40 of the housing 28, a locking pin 32 that fits into locking holes 42, 44, and a pivot pin 34 that fits into a pivot hole 46. While FIGS. 2A and 2B show one side of the user interface 20, in some embodiments, the opposite side of the user interface 20 is symmetrical, with a corresponding button 31 and pins 33, 35 that fit into a respective slot 41 and holes 43, 45, 47, shown in FIGS. 4 and 5, which is discussed in greater detail below.

As shown in FIG. 2A, when the user interface 20 is in the untilted position, the locking pins 32, 33 of the module 26 fit into the locking holes 42, 43. To tilt the user interface 20, the buttons 30 and 31 can be depressed, disengaging the locking pins 32, 33 from the locking holes 42, 43. The module 26 can then be adjusted and tilted upwards, such that the bottom of the module 26 moves out away from the body of the UPS 10. The buttons 30, 31 move in respective button slots 40, 41 sliding toward the front plane of the housing 28. The locking pins 32, 33 can be engaged into a second pair of locking holes 44, 45, located closer to the front face of the housing 28 than the first pair of locking holes 42, 43. Thus, the module 26 can be held in a tilted position within the housing 28, as shown in FIG. 2B.

While FIGS. 2A and 2B show two positions of locking holes 42, 44, it should be understood that the housing 28 can have any desired number of sets of locking holes to provide various positions and angles at which the module 26 can be held. Further, while the illustrated embodiments show locking pins 32, 33 configured to fit into locking holes 42, 43, 44, 45, other locking mechanisms can be used. For example, the locking pins 32, 33 can be fitted with a cushioning material that provides enough friction against the inside of the housing 28 that locking holes 42, 43 are not needed. In this way, the module 26 can be held in any position within the range of the limits of the movements of the buttons 30, 31 in the button slots 40, 41. Alternatively, or additionally, the inside of the housing 28 can be configured with ridges to provide a ratcheting mechanism for the locking pins 32, 33. For example, the ratcheting mechanism can allow the module 26 to be tilted upward within the housing 28 without depressing the buttons 30, 31 but lock the module 26 from sliding back into an untilted position unless the buttons 30, 31 are depressed.

The pivot holes 46, 47 are also configured to allow the respective pivot pins 34, 35 to slide within the pivot holes 46, 47. The pivot pins 34, 35 slide from a top or upper portion of the pivot holes 46, 47 to a bottom or lower portion of the pivot holes 46, 47 as the module 26 moves from an untilted to a tilted position. The pivot pins 34, 35 being configured to move in respective pivot holes 46, 47 allows the module 26 to tilt in the housing 28 without the module 26 having to recede into the housing 28 or into the body of the UPS 10. As the entire module 26 can slide down within the housing 28 because the pivot pins 34, 35 can move, the top of the module 26 remains a relatively same distance from the body of the UPS 10 or front plane of the housing 28 while the bottom of the module 26 tilts outward. Since the module 26 does not substantially recede into the housing 28, the front face 22 of the user interface 20 is not blocked by the housing 28 or the body of the UPS 10 as would potentially occur if the module 26 were to tilt with a fixed pivot pin in a fitted pivot hole.

Figure 3:
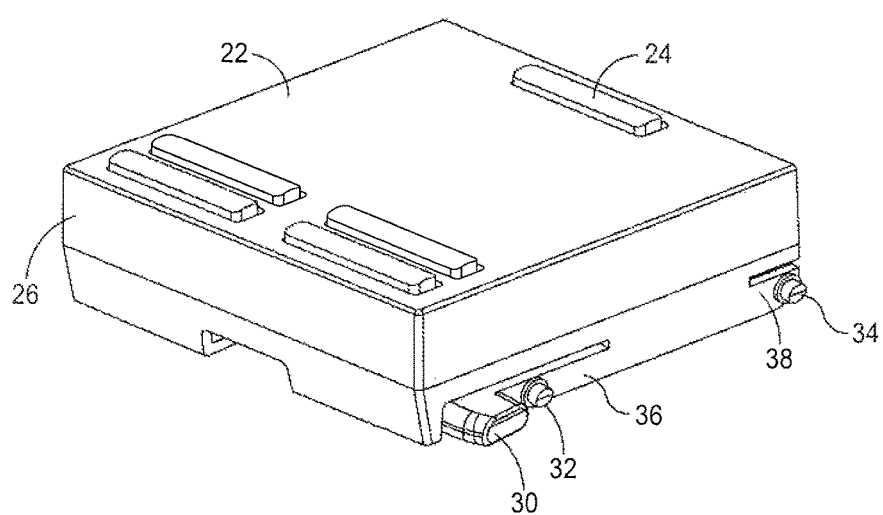
FIG. 3 is a perspective view of a front face of a module of the adjustable user interface.

Referring to FIG. 3, the module 26 is shown separate from the housing 28. The front face 22 of the module 26 is shown with five input buttons 24, but it should be appreciated that any desired number of input buttons and/or keys can be provided as appropriate to interface with the UPS 10. The front face 22 can also include a screen for providing information visually to the user regarding the UPS 10, such as states, modes, and configurations of the UPS 10.

Figure 4:
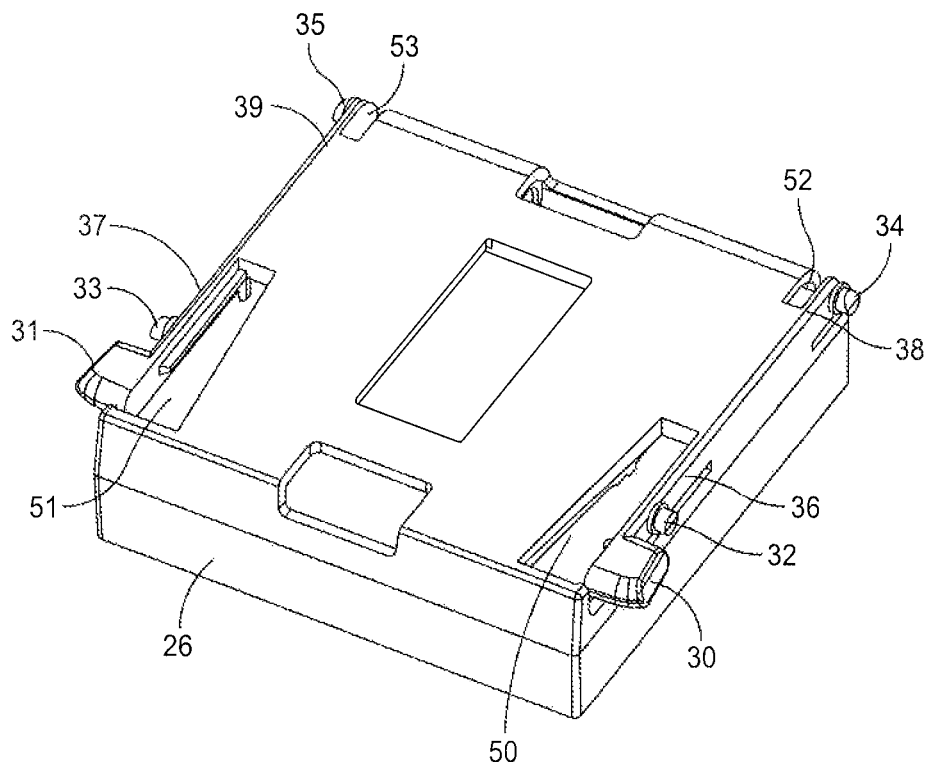
FIG. 4 is a perspective view of a rear of the module of the adjustable user interface.

The button 30 and the locking pin 32 are connected on a lever 36. Thus, when the button 30 is depressed, the locking pin 32 also recedes into the body of the module 26. The pivot pin 34 is also located on a pivot lever 38, which allows for lateral flexibility of the pivot pin 34 as it slides in the pivot hole 46. Referring also to FIG. 4, a similar configuration is shown on the opposite side. The corresponding button 31 and locking pin 33 are connected on a corresponding lever 37. Lever cutouts 50, 51 on the rear of the module 26 allow for the levers 36, 37 and attached buttons 30, 31 and locking pins 32, 33 to depress into the body of the module 26. Similarly, the pivot levers 38, 39 deflect into pivot lever cutouts 52, 53 on the rear of the module 26. The levers 36, 37 and the pivot levers 38, 39 are all constructed of a material, such as plastic, that provides sufficient flexibility that the buttons 30, 31 can be depressed far enough to disengage the locking pins 32, 33 from respective locking holes 42, 43 without the levers 36, 37 breaking. However, the material and structure of the levers 36, 37 also provide sufficient stiffness that the levers 36, 37 spring back to reengage the locking pins 32, 33 into respective locking holes 42, 43 upon proper alignment of the module 26 within the housing 28.

Figure 5:
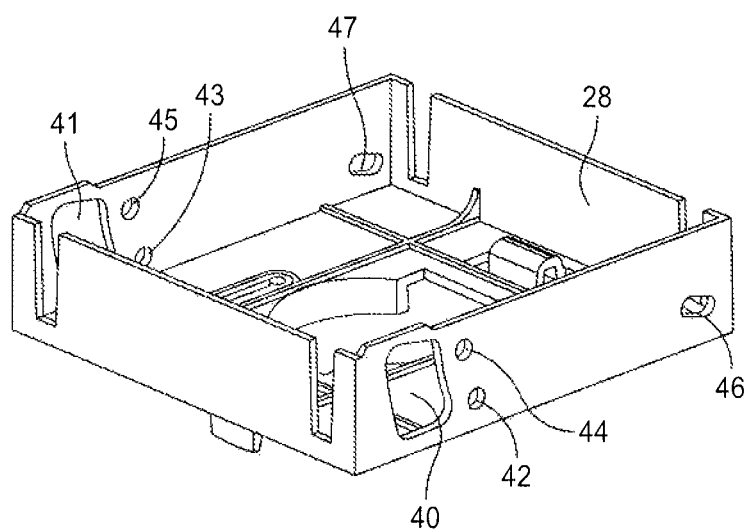
FIG. 5 is a perspective view of a housing of the adjustable user interface.

Referring to FIG. 5, the housing 28 is shown without the module 26. The corresponding button slot 41 is opposite the button slot 40, as well as corresponding locking holes 43, 45 opposite respective locking holes 42, 44. The corresponding pivot hole 47 is opposite the pivot hole 46, with both pivot holes 46, 47 located toward the top of the housing 28. The second pair of locking holes 44, 45 are located toward the front plane of the housing 28 relative to the first pair of locking holes 42, 43, as well as slightly toward the bottom of the housing 28, allowing for the sliding of the module 26 within the housing 28 when tilting. The button slots 40, 41 are also curved to accommodate the sliding of the buttons 30, 31 in a slightly bottomward direction as the module 26 tilts. Similarly, the pivot holes 46, 47 are slanted to allow the module 26 to slide downwards and tilt outwards without having to recede into the housing 28. The housing 28 can be configured such that the back of the housing 28 can attached to the body of the UPS 10 in various manners as known in the art.

Figure 6:
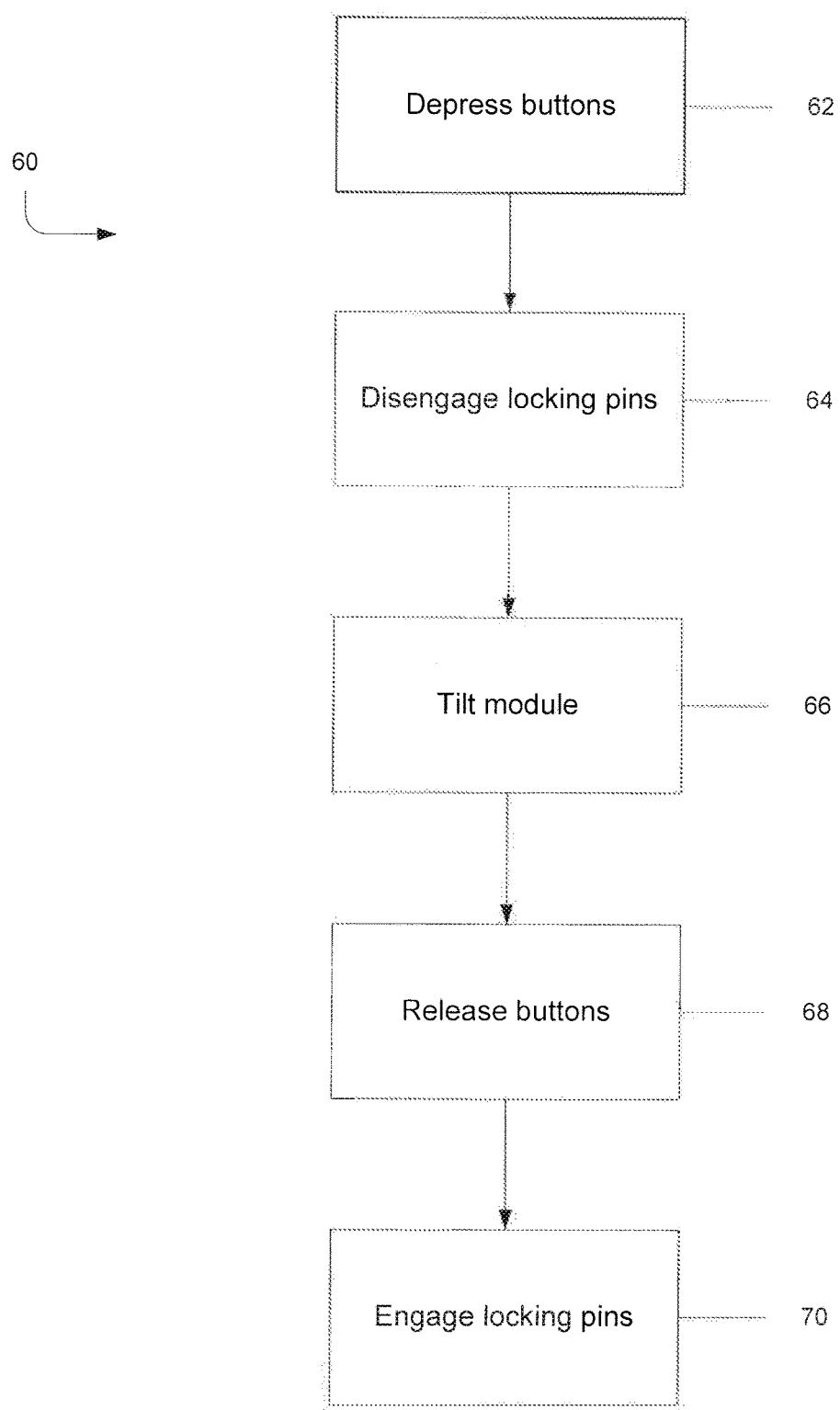
FIG. 6 is a flowchart illustrating adjusting the user interface of the uninterruptible power supply.

Referring to FIG. 6, a flowchart 60 illustrates adjusting the user interface 20 of the UPS 10 with reference to the disclosed embodiments. At step 62, the buttons 30, 31 are depressed. The buttons 30, 31 are depressed into the body of the module 26, deflecting the levers 36, 37 into the lever cutouts 50, 51. At step 64, the locking pins 32, 33 are disengaged from respective locking holes 42, 43. The depressing of the buttons 30, 31 allow the lock pins 32, 33 to disengage as the buttons 30, 31 and the locking pins 32, 33 are connected by respective levers 36, 37. Thus, depressing the buttons 30, 31 far enough into the respective lever cutouts 50, 51 can deflect the locking pins 32, 33 enough to disengage the locking pins 32, 33 from the respective locking holes 42, 43.

At step 66, the module 26 is tilted within the housing 28. With the locking pins 32, 33 disengaged, the module 26 is free to move within the housing 28, pivoting at the top of the module 26 where the pivot pins 34, 35 remain moveably engaged in respective pivot holes 46, 47. Thus, the module 26 can be tilted upwards, such that the front face 22 of the module 26 produces an angle relative to the front plane of the housing 28.

At step 68, the buttons 30, 31 are released. Once the module 26 is tilted to a desired angle, the buttons 30, 31 can be released. Releasing the buttons 30, 31 allows the levers 36, 37 to spring back into position, along with respective locking pins 32, 33. At step 70, the locking pins 32, 33 are engaged into the respective second set of locking holes 44, 45, thus locking the module 26 in place in the desired position. Locking the module 26 into position allows the user to press input buttons and/or keys 24 on the user interface 20 without the module 26 moving around in the housing 28.

It should be appreciated that the buttons 30, 31 can also be released once the module 26 is tilted enough that the locking pins 32, 33 are not aligned with the locking holes 42, 43. With the appropriate stiffness of the levers 36, 37, releasing the buttons 30, 31 will cause the locking pins 32, 33 to spring back into position. Once the module 26 is tilted beyond the aligning of the locking pins 32, 33 with the locking holes 42, 43, the locking pins 32, 33 will press against the inside of the housing 28. The module 26 can then still be tilted within the housing 28 until the locking pins 32, 33 are aligned with the second set of locking holes 44, 45, where the locking pins 32, 33 will engage with the second set of locking holes 44, 45.

While the method has been described with the module 26 being moved from the first set of locking holes 42, 43 to the second set of locking holes 44, 45, it should be appreciated that a similar method can be used to move the module 26 from the second set of locking holes 44, 45 to the first set of locking holes 42, 43 or from any first position to any second position.

Having thus described several aspects of at least one embodiment, it is to be appreciated various alterations, modifications, and improvements will readily occur to those skilled in the art. Such alterations, modifications, and improvements are intended to be part of this disclosure and are intended to be within the scope of the disclosure. Accordingly, the foregoing description and drawings are by way of example only, and the scope of the disclosure should be determined from proper construction of the appended claims, and their equivalents.

What is claimed is:

1. A user interface module for an uninterruptible power supply, the user interface module comprising:
a housing having:
a front plane;
a backing surface, the backing surface configured to attach to a body of the uninterruptible power supply;
a top surface;
two side surfaces; and
a bottom surface, wherein each side surface comprises a pivot hole positioned near the top surface, a button slot positioned near the bottom surface, and at least a first and a second locking hole positioned above the button slot; and
a module configured to fit inside and secured by the housing, the module including:
a body having a front face, the module being configured to tilt within the housing such that the front face of the module can be positioned at various angles relative to the front plane of the housing, wherein the body of the module has two lateral surfaces, each lateral surface comprising a cutout;
two pivot pins configured to fit in respective pivot holes;
two buttons configured to move in respective button slots responsive to being depressed by a user; and
two lock pins configured to fit in respective locking holes, wherein the button and the lock pin on each lateral surface of the module are connected to each other and configured such that the lock pins can disengage from respective locking holes to an extent that the buttons recede into their respective cutouts responsive to the buttons being depressed by the user.

2. The user interface module of claim 1, wherein the module is configured to tilt such that a bottom of the front face extends further than a top of the front face relative to the front plane of the housing.

3. The user interface module of claim 2, wherein the module is configured to tilt without the top of the front face receding into the housing.

4. The user interface module of claim 1, wherein the pivot holes are configured such that the pivot pins can slide to more than one position within respective pivot holes.

5. The user interface module of claim 4, wherein the pivot pins are configured to slide to a top of respective pivot holes when the module is tilted at zero degrees relative to the front plane of the housing and to a bottom of the pivot holes when the module is tilted at a maximum degree relative to the front plane of the housing case.

6. The user interface module of claim 1, wherein the front face of the module comprises a screen.

7. The user interface module of claim 6, wherein the front face of the module further comprises user input buttons.

8. A method for adjusting a user interface module for an uninterruptible power supply, the method comprising:
attaching a housing having a front plane and a backing surface to a body of the uninterruptible power supply via the backing surface, wherein the housing further comprises a top surface, two side surfaces, and a bottom surface, each side surface including a pivot hole positioned near the top surface, a button slot positioned near the bottom surface, and at least a first and a second locking hole positioned above the button slot; and
moving a module including a body having a front face, the module being configured to fit inside and secured by the housing, wherein:
the front face of the module is positioned at an angle relative to the front plane of the housing;
the module comprises two pivot pins configured to fit in respective pivot holes, two buttons configured to move in respective button slots responsive to being depressed by a user, and two lock pins configured to fit in respective locking holes;
the body of the module has two lateral surfaces, each lateral surface comprising a cutout;
the button and the lock pin on each lateral surface of the module are connected to each other and configured such that the lock pin can disengage from the respective locking hole to an extent that the button recedes into its respective cutout responsive to the button being depressed by the user; and
moving the module comprises depressing the buttons into the cutouts to disengage the lock pins from a first pair of the respective locking holes, tilting the module relative to the front plane of the housing, and releasing the buttons such that the lock pins engage a second pair of the respective locking holes.

9. The method of claim 8, wherein moving the module comprises tilting the module such that a bottom of the front face extends further than a top of the front face relative to the front plane of the housing.

10. The method of claim 9, wherein moving the module comprises tilting the module without the top of the front face receding into the housing.

11. The method of claim 8, wherein the pivot holes are configured such that the pivot pins can slide to more than one position within respective pivot holes, and wherein moving the module comprises sliding to a top of respective pivot holes when the module is tilted at zero degrees relative to the front plane of the housing and to a bottom of the pivot holes when the module is tilted at a maximum degree relative to the front plane of the housing case.

12. The method of claim 8, wherein the front face of the module comprises a screen, and wherein moving the module comprises changing an angle of visibility of the screen.

13. The method of claim 12, wherein the front face of the module further comprises user input buttons, and wherein moving the module comprises changing an angle of accessibility of the input buttons.

* * * * *